(12) United States Patent
Liggiero, III et al.

(10) Patent No.: US 7,957,924 B2
(45) Date of Patent: *Jun. 7, 2011

(54) SYSTEM AND METHOD FOR DISTORTION ANALYSIS

(75) Inventors: Richard Liggiero, III, Tewksbury, MA (US); Alan J. Reiss, Wayland, MA (US)

(73) Assignee: LTX-Credence Corporation, Norwood, MA (US)

( * ) Notice: Subject to any disclaimer, the term of this patent is extended or adjusted under 35 U.S.C. 154(b) by 321 days.

This patent is subject to a terminal disclaimer.

(21) Appl. No.: 12/118,217

(22) Filed: May 9, 2008

(65) Prior Publication Data

US 2009/0043522 A1 Feb. 12, 2009

Related U.S. Application Data

(60) Provisional application No. 60/954,439, filed on Aug. 7, 2007.

(51) Int. Cl.
*G01R 29/00* (2006.01)
*G06F 13/00* (2006.01)
(52) U.S. Cl. .......... 702/69; 702/189; 702/109; 702/124; 327/100
(58) Field of Classification Search ............... 702/69, 702/189, 109, 124
See application file for complete search history.

(56) References Cited

U.S. PATENT DOCUMENTS

| | | | |
|---|---|---|---|
| 4,486,688 A | 12/1984 | Schmitz | |
| 5,185,657 A * | 2/1993 | Ozaki et al. | 348/654 |
| 6,694,462 B1 * | 2/2004 | Reiss et al. | 714/724 |
| 6,701,280 B2 * | 3/2004 | Horne et al. | 702/177 |
| 6,850,044 B2 | 2/2005 | Hansen et al. | |
| 7,664,621 B2 * | 2/2010 | Liggiero et al. | 702/189 |
| 2005/0078026 A1 * | 4/2005 | Cai | 341/162 |

* cited by examiner

*Primary Examiner* — Hal D Wachsman
(74) *Attorney, Agent, or Firm* — Holland & Knight LLP; Brian J Colandreo, Esq.; Mark H Whittenberger, Esq.

(57) ABSTRACT

A method, circuit, and computer program product for receiving a first intermediate signal that is at least partially based upon a first reference signal. A second intermediate signal is received that is a time-shifted version of the first intermediate signal. An output signal is generated that is based upon the difference between the first intermediate signal and the second intermediate signal. An anticipated differential change in the output signal is determined, the anticipated differential change to occur based upon a transition in the first reference signal. A realized differential change in the output signal is measured, the realized differential change occurring based upon a transition in the first reference signal. The realized differential change in the output signal is compared to the anticipated differential change in the output signal to determine a nonlinearity indicator.

21 Claims, 3 Drawing Sheets

SYSTEM AND METHOD FOR DISTORTION ANALYSIS

RELATED APPLICATIONS

This disclosure claims the benefit of U.S. Provisional Patent Application No. 60/954,439, which is entitled RELATIVE SWITCHING DIFFERENTIAL MEASUREMENT and was filed on 7 Aug. 2007.

TECHNICAL FIELD

This disclosure relates to analyzing distortion of a device and, more particularly, to the measurement and determination of distortion characteristics as they relate to a system transfer function.

BACKGROUND

When measuring the nonlinearity distortion imparted by a device under test, the device under test is typically driven by a reference signal and the device under test provides an intermediate signal as a result. Upon transitions of the reference signal, differential changes in the intermediate signal are measured and compared to their expected values according to the intended transfer function of the device under test. As these differential changes are typically very small, the required measurement accuracy may be compromised when the signal to be measured is buried within the noise floor. Therefore, a notch and gain approach may be used to measure them. A difference and gain approach typically involves providing the intermediate signal to one terminal of a differential amplifier, and providing a base signal to the other terminal of the differential amplifier. As the base signal is close in amplitude to that of the intermediate signal, the base signal nearly cancels out (i.e. notches) the intermediate signal and the differential amplifier then amplifies the difference between the two signals and provides this amplified difference in the form of an output signal. Upon a transition in the reference signal, the resulting differential change in the output signal is measured rather than the intermediate signal, and compared to an anticipated value.

There are two traditional methods of providing the base signal. A first method involves connecting a variable bucking or Pedestal source as a base signal reference. This method is often used when testing the nonlinearity of a Digital-to-Analog Converter (DAC). To save testing time and expense for this type of DAC, it is common to test transitions only at the "major carries." As is known in the art, "major carries" are transitions wherein the next major bit (on a digital reference signal) changes from a zero to a one. This occurs when the lower order bits are all ones and in the transition become all zeroes such that they have 'carried over' to the next adjacent higher order bit. For example, a transition from B0111 to B1000 is a "major carry" transition (i.e., for a four bit DAC with the Segmentation ⅓). When utilizing the "major carry" method, a variable source provides the base signal and is set to a value at or near the DAC's output value while the reference signal is one of the major carry values. The reference signal is then incremented (or decremented) and the differential change is measured through the notch and gain technique as described above. The problem with this method is that it requires an expensive second device (i.e., the variable source) capable of precisely generating a range of values at or near the major carry output value of the DAC, as well as maintaining this signal level/stability, over the entire measurement acquisition time.

A second method of providing a base signal gained popularity with the acceptance of segmented DACs. This second method involves using a second DAC, superior to the device under test, as the base signal reference source. In this method, the second DAC (i.e. the reference DAC) is driven by the same reference signal that drives the device under test. Because the reference DAC changes its output at the same time as the device under test, it is always supplying a reference signal at or near the output value of the device under test. In other words, the reference signal is stepping (i.e. bucking) in sync with the device under test. Accordingly, the reference DAC is often referred to as a "bucking DAC". Unfortunately with respect to this method, the differential change measured by the notch and gain technique is now a combination of the differential changes of the outputs of both the device under test and the bucking DAC, because they each change at the same time in response to the reference signal. Therefore, the characteristics of the bucking DAC must be well known in order to isolate the nonlinearity of the device under test. Accordingly, the bucking DAC must have a higher resolution, be more stabile, have greater accuracy, and make less noise than the device under test.

SUMMARY OF THE DISCLOSURE

In a first implementation, a method includes receiving a first intermediate signal that is at least partially based upon a first reference signal. A second intermediate signal is received that is a time-shifted version of the first intermediate signal. An output signal is generated that is based upon the difference between the first intermediate signal and the second intermediate signal. An anticipated differential change in the output signal is determined, the anticipated differential change to occur based upon a transition in the first reference signal. A realized differential change in the output signal is measured, the realized differential change occurring based upon a transition in the first reference signal. The realized differential change in the output signal is compared to the anticipated differential change in the output signal to determine a nonlinearity indicator.

One or more of the following features may be included. The first reference signal may be a first digital reference signal. The first digital reference signal may be provided to a device under test such that the device under test generates the first intermediate signal. The device under test may include a digital-to-analog converter.

The first reference signal may be a first analog reference signal. The first analog reference signal may be provided to a device under test such that the device under test generates the first intermediate signal. The device under test may include an amplifier.

In another implementation, a circuit is configured to perform operations including receiving a first intermediate signal that is at least partially based upon a first reference signal. A second intermediate signal is received that is a time-shifted version of the first intermediate signal. An output signal is generated that is based upon the difference between the first intermediate signal and the second intermediate signal. An anticipated differential change in the output signal is determined, the anticipated differential change to occur based upon a transition in the first reference signal. A realized differential change in the output signal is measured, the realized differential change occurring based upon a transition in the first reference signal. The realized differential change in the output signal is compared to the anticipated differential change in the output signal to determine a nonlinearity indicator.

One or more of the following features may be included. The first reference signal may be a first digital reference signal. The first digital reference signal may be provided to a device under test such that the device under test generates the first intermediate signal. The device under test may include a digital-to-analog converter.

The first reference signal may be a first analog reference signal. The first analog reference signal may be provided to a device under test such that the device under test generates the first intermediate signal. The device under test may include an amplifier.

In another implementation, a computer program product resides on a computer readable medium that has a plurality of instructions stored on it. When executed by a processor, the instructions cause the processor to perform operations including receiving a first intermediate signal that is at least partially based upon a first reference signal. A second intermediate signal is received that is a time-shifted version of the first intermediate signal. An output signal is generated that is based upon the difference between the first intermediate signal and the second intermediate signal. An anticipated differential change in the output signal is determined, the anticipated differential change to occur based upon a transition in the first reference signal. A realized differential change in the output signal is measured, the realized differential change occurring based upon a transition in the first reference signal. The realized differential change in the output signal is compared to the anticipated differential change in the output signal to determine a nonlinearity indicator.

One or more of the following features may be included. The first reference signal may be a first digital reference signal. The first digital reference signal may be provided to a device under test such that the device under test generates the first intermediate signal. The device under test may include a digital-to-analog converter.

The first reference signal may be a first analog reference signal. The first analog reference signal may be provided to a device under test such that the device under test generates the first intermediate signal. The device under test may include an amplifier.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION OF THE DISCLOSURE

Figure 1:
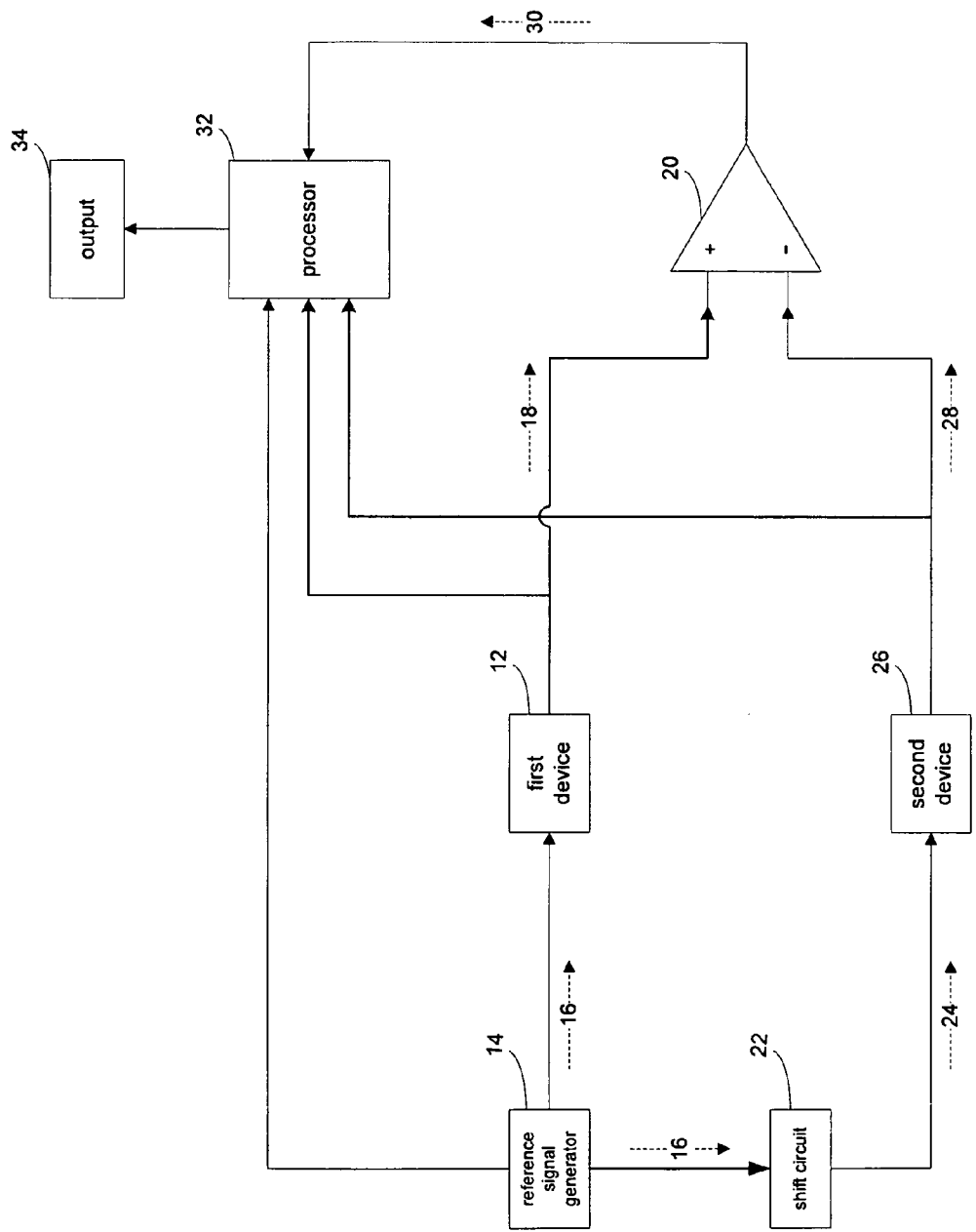
FIG. 1 is a block diagram of a transfer function mapping system.

Referring to FIG. 1, there is shown transfer function mapping system 10 for measuring the nonlinearity of a device under test (e.g., first device 12). Reference signal generator 14 may provide first reference signal 16 to first device 12, and the resulting intermediate signal 18 generated by first device 12 may be provided to one terminal of comparator 20. An example of reference signal generator 14 may include but is not limited to an automatic electronic tester manufactured by LTX Corporation of Norwood Mass. An example of comparator 20 may include but is not limited to AD8250 manufactured by ADI of Norwood, Mass.

In situations in which first device 12 is ideally expected to respond in a linear fashion to input signals (e.g., first reference signal 16), monitoring first intermediate signal 18 in relation to first reference signal 16 may provide the capability of determining the nonlinear characteristics of first device 12.

Reference signal generator 14 may also provide reference signal 16 to shift circuit 22. Shift circuit 22 may be any circuit that enables first reference signal 16 to be time-shifted, example of which may include but are not limited to automatic electronic tester manufactured by LTX Corporation of Norwood, Mass.

Shift circuit 22 may delay first reference signal 16 to generate second referenced signal 24. Second reference signal 24 may be a time-shifted version of first reference signal 16. Second reference signal 24 may be provided to second device 26. Second device 26 may process second reference signal 24 and generated second intermediate signal 28.

For example, shift circuit 22 may include a time delay circuit that delays the propagation of first reference signal 16 through shift circuit 22 (thus producing second reference signal 24). Alternatively, shift circuit 22 may include a sample-and-hold circuit that is clocked to sample first reference signal 16 at the appropriate points required to produce second reference signal 24.

Examples of first reference signal 16 and second reference signal 24 may include, but are not limited to, an analog reference signal and a digital reference signal. If first reference signal 16 and/or second reference signal 24 is a digital signal, the device to which first reference signal 16 and/or second reference signal 24 is applied (namely first device 12/shift circuit 22 and/or second device 26) must be a device capable of receiving a digital signal (unless a digital-to-analog converter is utilized). Conversely, if first reference signal 16 and/or second reference signal 24 is an analog signal, the device to which first reference signal 16 and/or second reference signal 24 is applied (namely first device 12/shift circuit 22 and/or second device 26) must be a device capable of receiving an analog signal (unless a analog-to-digital converter is utilized).

As discussed above, first device 12 may be a device under test; and the type of signal applied to first device 12 may vary depending on the type of device being tested. For example and for illustrative purposes only, if first device 12 is a digital-to-analog converter, first reference signal 16 may be a digital signal applied to the digital-to-analog converter. Alternatively, if first device 12 is an analog amplifier, first reference signal 16 may be an analog signal (that may be capable of defining one or more discrete levels.

Second device 26 may be a device equivalent/similar to first device 12; and the type of signal applied to second device 26 may vary depending on the type of device being tested. For example and for illustrative purposes only, if second device 26 is a digital-to-analog converter, second reference signal 24 may be a digital signal applied to the digital-to-analog converter. Alternatively, if second device 26 is an analog amplifier, second reference signal 24 may be an analog signal (that may be capable of defining one or more discrete levels.

Figure 2:
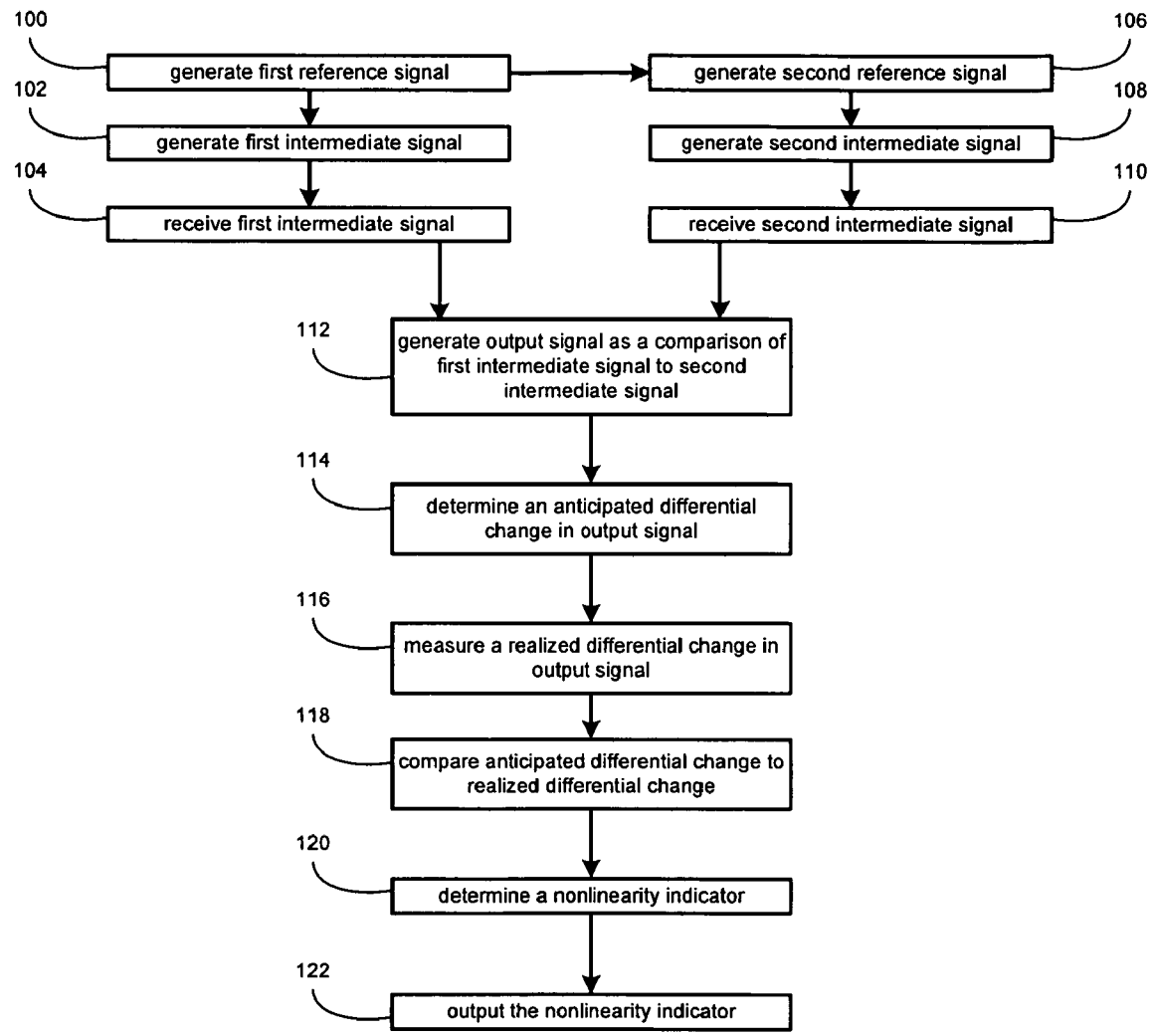
FIG. 2 is a flowchart of a process executed by the transfer function mapping system of FIG. 1.

For illustrative purposes and referring also to FIG. 2, reference signal generator 14 may generate 100 first reference signal 16 that may be provided to first device 12 and shift circuit 22. First device 12 may process first reference signal 16 and generate 102 first intermediate signal 18, which may be received 104 by comparator 20 and responsive to first reference signal 16.

As discussed above and for illustrative purposes only, first device 12 may be a digital-to-analog converter or an amplifier. Accordingly, if first device 12 is a digital-to-analog converter, first reference signal 16 generated 100 by reference signal generator 12 may be a digital reference signal, which may be processed by the digital-to-analog converter (i.e., first device 12) to generate 102 first intermediate signal 18 (e.g., an analog representation of the digital reference signal).

Further, if first device 12 is an amplifier, first reference signal 16 generated 100 by reference signal generator 12 may be an analog reference signal, which may be processed by the amplifier (i.e., first device 12) to generate 102 first intermediate signal 18 (e.g., an amplified representation of the analog reference signal).

Since first intermediate signal 18 is at least partially based upon first reference signal 16, a variation in first reference signal 16 may cause a variation in first intermediate signal 18. Therefore, a transition in first reference signal 16 (e.g., a change in value such as, but not limited to, a change in the binary word in the case of a digital signal or a change in voltage in the case of an analog signal) may result in a transition in first intermediate signal 18. Unfortunately, due to variations in the internal structure of first device 12, first intermediate signal 18 may not vary linearly with respect to first reference signal 16.

As stated above, first reference signal 16 may also be provided to shift circuit 22. Shift circuit 22 may process first reference signal 16 and generate 106 second reference signal 24 that may be applied to second device 26. Second device 26 may process second reference signal 24 and generate 108 second intermediate signal 28, which may be received 110 by comparator 20 and responsive to second reference signal 24.

Since second intermediate signal 28 is at least partially based upon second reference signal 24, a variation in second reference signal 24 may cause a variation in second intermediate signal 28. Therefore, a transition in second reference signal 24 may result in a transition in second intermediate signal 28.

In order to accurately test the nonlinearity of first device 12, a comparison of first intermediate signal 18 and second intermediate signal 28 may be made (e.g., through a difference & gain technique). As will be discussed below in greater detail, through the use of transfer function mapping system 10, the nonlinearity of first device 12 may be tested when first reference signal 18 makes a transition.

When comparing the intermediate signals (e.g., comparing first intermediate signal 18 to second intermediate signal 28); comparator 20 may generate 112 output signal 30 that is based upon, at least in part, the difference between first intermediate signal 18 and second intermediate signal 28.

Figure 3:
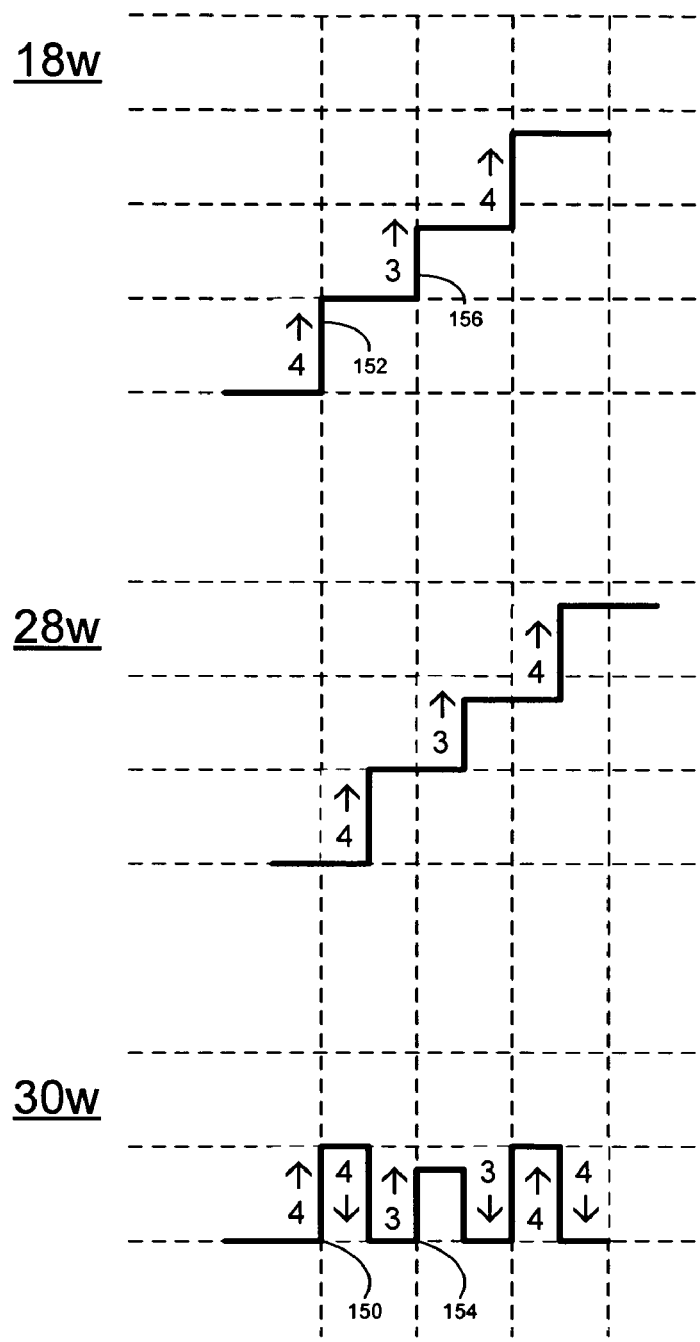
FIG. 3 is a diagrammatic view of a plurality of waveforms processed by the transfer function mapping system of FIG. 1.

Referring also to FIG. 3 and for illustrative purposes only, assume that first device 12 and second device 26 are both non-inverting devices, wherein the transfer function of a non-inverting device generates a monotonically increasing output in response to a monotonically increasing input. Further, assume for illustrative purposes that reference signal generator 12 is configured to produce a signal (first reference signal 16) that include discrete transitions of monotonically increasing values (e.g. through the use of binary words or analog voltages). Additionally, assume that shift circuit 22 delays first reference signal 16 to produce second reference signal 24. Further, assume that waveform 18w is indicative (in this illustrative example) of first intermediate signal 18, and that waveform 28w is indicative (in this illustrative example) of second intermediate signal 28, wherein waveform 28w is delayed (with respect to waveform 18w) by essentially half of a period.

Additionally, assume that waveform 30w is indicative (in this illustrative example) of output signal 30 generated by comparator 20. As discussed above, in this particular example, second intermediate signal 28 (as illustrated with waveform 28w) is shifted (i.e., time delayed) with respect to first intermediate signal 18 (as illustrated via waveform 18w). Accordingly, output signal 30 (as illustrated by waveform 30w) roughly resembles a variable amplitude square wave. Specifically, while waveform 18w and waveform 28w both initially start out at essentially the same level, waveform 18w rises (e.g., four units) prior to waveform 28w (resulting in waveform 30w rising four units). When waveform 28w subsequently rises four units, waveform 30w falls four units. Waveform 30w may stay low until waveform 18w rises three units, at which point waveform 30w rises three units. The above-described transitions are for illustrative purposes only and are specific (in this example) to the particular polarities and connections of comparator 20.

The above-describe waveforms (waveforms 18w, 28w and 30w) are merely for illustrative purposes only and are not intended to be a limitation of this disclosure, as other waveforms may be utilized. Specifically, first device 12 and/or second device 26 may not be non-inverting. Further, first reference signal 16 and/or second reference signal 24 may not monotonically increase.

Processor 32 may determine 114 an anticipated differential change (not shown) in output signal 30 based upon a transition in first reference signal 16. Processor 32 may execute one or more instruction sets and/or subroutines in order to effectuate the functionality of transfer function mapping system 10. These instruction sets and/or subroutines may be stored on a storage device (not shown) accessible by processor 32. Examples of the storage device (not shown) may include but are not limited to a hard disk drive, a tape drive, an optical drive, a RAID array, a random access memory (RAM), or a read-only memory (ROM).

When processor 32 is determining 114 the anticipated differential change, various methodologies may be utilized. For example and for illustrative purposes only, processor 32 may determine an anticipated differential change in output signal 30 by accessing pre-stored values of anticipated differential changes, which may be stored within the above-described storage device (not shown) accessible by processor 32.

Alternatively, processor 32 may determine an anticipated differential change in output signal 30 by calculation, which may be accomplished e.g. by: monitoring the first reference signal 16; accessing pre-stored information regarding one or more transitions in first reference signal 16; accessing pre-stored information of the details of the operational characteristics of first device 12; and/or accessing pre-stored mappings of the transfer function ideally implemented by first device 12.

For example, assume that first device 12 and second device 26 are each non-inverting amplifiers having a gain set to four. Further, assume that first reference signal 14 and second reference signal 26 (which is a time-delayed version of first reference signal 16) are analog reference signals having an initial value of 100 millivolts. Accordingly, if first device 12 and second device 26 are each operating ideally, first intermediate signal 18 and second intermediate output signal 22 would each have a value of 4 (0.100 volts) or 0.400 volts.

Assume for illustrative purposes that first reference signal 16 is incremented upward one millivolt (e.g., from 100 millivolts to 101 millivolts). Accordingly, processor 32 may determine 114 the anticipated differential change (not shown) in output signal 30 based upon the one millivolt transition in first reference signal 16. Specifically, since first device 12 has a gain of four (as discussed above), the anticipated differential change (as determined 114 by processor 32) would be 4 (0.001 volts) of 0.004 volts.

Processor 32 may measure 116 a first realized differential change (not shown) in output signal 30 based upon a transition in first reference signal 16. For example, processor 32 may measure 116 a realized differential change in output signal 30 by measuring a leading-edge rise (e.g., leading edge rise 150) within output signal 30. Voltage monitoring circuitry (not shown) may be incorporated into transfer function mapping system 10. Accordingly and utilizing such voltage monitoring circuitry (not shown), transfer function mapping system 10 may monitor the voltage level of output signal 30 just before and just after leading edge rise 150 (which corresponds with leading edge rise 152 in waveform 18w and a corresponding leading edge rise (not shown) in first reference signal 16) to measure 116 the realized differential change (not shown) in output signal 30 based upon the transition in first reference signal 16. For illustrative purposes only and as illustrated in waveform 18w, assume that transfer function mapping system 10 measures 118 a realized differential change of 0.004 volts.

An example of the above-described voltage monitoring circuitry may include but is not limited to an analog-to-digital converter that converts output signal 30 into a digital signal, thereby allowing processor 32 to measure 116 the realized differential change in output signal 30.

Once transfer function mapping system 10 determines 114 the anticipated differential change and measures 116 the realized differential change in output signal 30, processor 32 of transfer function mapping system 10 may compare 118 the anticipated differential change to the realized differential change to determine a nonlinearity indicator.

For example and continuing with the above-stated example, the anticipated differential change was determined 114 to be 0.004 volts. Further, the realized differential changes was measured 116 to be 0.004 volts. Accordingly, processor 32 within transfer function mapping system 10 may compare 118 the anticipated differential change (i.e., 0.004 volts) to the realized differential change (i.e., 0.004 volts) and calculate 120 a nonlinearity indicator of 0.000 volts (i.e., 0.004 volts–0.004 volts).

Once the nonlinearity indicator is calculated 120, the nonlinearity indicator may be output 122 to e.g., storage devices, display devices, printing devices, downstream processing devices, or various other output devices (collectively illustrated as output devices 34). Additionally, by determining 114, measuring 116, and comparing 120 multiple differential changes over a period of time, a plurality of nonlinearity indicators may be determined 120 as a result of a series of transitions, wherein this plurality of nonlinearity indicators may be output 122 (respectively) for subsequent processing.

For example, assume for illustrative purposes that first reference signal 16 is again incremented upward one millivolt (e.g., from 101 millivolts to 102 millivolts). Accordingly, processor 32 may determine 114 the anticipated differential change (not shown) in output signal 30 based upon the one millivolt transition in first reference signal 16. Specifically, since first device 12 has a gain of four (as discussed above), the anticipated differential change (as determined 114 by processor 32) would be 4 (0.001 volts) or 0.004 volts.

Processor 32 may measure 116 a first realized differential change (not shown) in output signal 30 based upon a transition in first reference signal 16. For example, processor 32 may measure 116 a realized differential change in output signal 30 by measuring the next leading-edge rise (e.g., leading edge rise 154) within output signal 30. Transfer function mapping system 10 may monitor the voltage level of output signal 30 just before and just after leading edge rise 154 (which corresponds with leading edge rise 156 in waveform 18w and a corresponding leading edge rise (not shown) in first reference signal 16) to measure 116 the realized differential change (not shown) in output signal 30 based upon the transition in first reference signal 16. For illustrative purposes only and as illustrated in waveform 18w, assume that transfer function mapping system 10 measures 116 a realized differential change of 0.003 volts.

Once transfer function mapping system 10 determines 114 the anticipated differential change and measures 116 the realized differential change in output signal 30, processor 32 of transfer function mapping system 10 may compare 118 the anticipated differential change to the realized differential change to determine a nonlinearity indicator.

For example and continuing with the above-stated example, the anticipated differential change was determined 114 to be 0.004 volts. Further, the realized differential change was measured 116 to be 0.003 volts. Accordingly, processor 32 within transfer function mapping system 10 may compare 118 the anticipated differential change (i.e., 0.004 volts) to the realized differential change (i.e., 0.003 volts) and calculate 120 a nonlinearity indicator of 0.001 volts (i.e., 0.004 volts–0.003 volts).

Transfer function mapping system 10 may be implemented as automated test equipment, wherein comparator 20, processor 32, and reference signal generator 12 are all provided in an apparatus that further supplies a connection point for each of first device 12 and second device 26 to be connected by the user.

Transfer function mapping system 10 may also be incorporated into the device to be tested (e.g., first device 12), thus allowing for self-analysis and/or self-configuration of the device into which transfer function mapping system 10 is incorporated. For example, a digital-to-analog converter may incorporate a comparator and processor to perform the same or similar functions as comparator 20 and processor 32 as disclosed above. Accordingly, a series of transitions may be analyzed at power up (e.g. as a power on self test) or at intervals during operation to allow for self-calibration with respect to one or more calculated nonlinearities.

While system 10 is described above as having shift circuit 22 positioned before second device 26, this is for illustrative purposes only and is not intended to be a limitation of this disclosure. Specifically, shift circuit 22 may be positioned after second device 26. Accordingly, first device 12 and second device 26 may be provided with identical reference signals from reference signal generator 14. However, second intermediate signal 28 may be processed by shift circuit 22 to e.g., time-shift second intermediate signal 28.

One or more of first reference signal 16 (and corresponding first intermediate signal 18) and second reference signal 24 (and corresponding second intermediate signal 28) may be sawtooth waveforms. Transfer function mapping system 10 may execute a phase alignment process (with respect to one or more of first reference signal 16, corresponding first intermediate signal 18, second reference signal 24 and/or corresponding second intermediate signal 28) to allow for easier correlation between the input signal(s) applied to e.g., comparator 20 and the various edges of output signal 30.

Transfer function mapping system 10 may accomplish this phase alignment in various ways and this disclosure is not intended to be limited to any particular alignment process. As an illustrative example, transfer function mapping system 10 may e.g., process a portion of the digital samples that define one or more of the above-described signals. The processing performed by transfer function mapping system 10 may include (but is not limited to) averaging and/or balancing the individual digital samples. Due to the repetitive nature of the digital samples, the processed digital samples may be examined to determine e.g., the point at which multiple null positions exist. These multiple null positions may then be used for phase alignment purposes. For example, the above-described repetitious signal may be phase asynchronous. Since each repetition (UTP) is of equal length and time, one UTP may be searched for a unique position (i.e., known 'a-priori') to phase align the UTP, such that UTP averaging may occur that effectively reduces the noise by 1/rt(N) UTP's.

A number of implementations have been described. Nevertheless, it will be understood that various modifications may be made. Accordingly, other implementations are within the scope of the following claims.

What is claimed is:

1. A method comprising:
receiving, at a comparator, a first intermediate signal that is at least partially based upon a first reference signal;
receiving, at the comparator, a second intermediate signal that is a time-shifted version of the first intermediate signal;
generating, at the comparator, an output signal that is based upon the difference between the first intermediate signal and the second intermediate signal;
determining, at a processor, an anticipated differential change in the output signal, the anticipated differential change to occur based upon a transition in the first reference signal;
measuring, at the processor, a realized differential change in the output signal, the realized differential change occurring based upon a transition in the first reference signal; and
comparing, at the processor, the realized differential change in the output signal to the anticipated differential change in the output signal to determine a nonlinearity indicator.

2. The method of claim 1 wherein the first reference signal is a first digital reference signal.

3. The method of claim 2 wherein the first digital reference signal is provided to a device under test such that the device under test generates the first intermediate signal.

4. The method of claim 3 wherein the device under test includes a digital-to-analog converter.

5. The method of claim 1 wherein the first reference signal is a first analog reference signal.

6. The method of claim 5 wherein the first analog reference signal is provided to a device under test such that the device under test generates the first intermediate signal.

7. The method of claim 6 wherein the device under test includes an amplifier.

8. A circuit configured to perform operations comprising:
a comparator configured to receive a first intermediate signal that is at least partially based upon a first reference signal, the comparator further configured to receive a second intermediate signal that is a time-shifted version of the first intermediate signal, the comparator being further configured to generate an output signal that is based upon the difference between the first intermediate signal and the second intermediate signal; and
a processor configured to determine an anticipated differential change in the output signal, the anticipated differential change to occur based upon a transition in the first reference signal, the processor further configured to measure a realized differential change in the output signal, the realized differential change occurring based upon a transition in the first reference signal, the processor being further configured to compare the realized differential change in the output signal to the anticipated differential change in the output signal to determine a nonlinearity indicator.

9. The circuit of claim 8 wherein the first reference signal is a first digital reference signal.

10. The circuit of claim 9 wherein the first digital reference signal is provided to a device under test such that the device under test generates the first intermediate signal.

11. The circuit of claim 10 wherein the device under test includes a digital-to-analog converter.

12. The circuit of claim 8 wherein the first reference signal is a first analog reference signal.

13. The circuit of claim 12 wherein the first analog reference signal is provided to a device under test such that the device under test generates the first intermediate signal.

14. The circuit of claim 13 wherein the device under test includes an amplifier.

15. A computer program product residing on a non-transitory computer readable medium having a plurality of instructions stored thereon which, when executed by a processor, cause the processor to perform operations comprising:
receiving, at a comparator, a first intermediate signal that is at least partially based upon a first reference signal;
receiving, at a comparator, a second intermediate signal that is a time-shifted version of the first intermediate signal;
generating, at a comparator, an output signal that is based upon the difference between the first intermediate signal and the second intermediate signal;
determining, at a processor, an anticipated differential change in the output signal, the anticipated differential change to occur based upon a transition in the first reference signal;
measuring, at a processor, a realized differential change in the output signal, the realized differential change occurring based upon a transition in the first reference signal; and
comparing, at a processor, the realized differential change in the output signal to the anticipated differential change in the output signal to determine a nonlinearity indicator.

16. The computer program product of claim 15 wherein the first reference signal is a first digital reference signal.

17. The computer program product of claim 16 wherein the first digital reference signal is provided to a device under test such that the device under test generates the first intermediate signal.

18. The computer program product of claim 17 wherein the device under test includes a digital-to-analog converter.

19. The computer program product of claim 15 wherein the first reference signal is a first analog reference signal.

20. The computer program product of claim 19 wherein the first analog reference signal is provided to a device under test such that the device under test generates the first intermediate signal.

21. The computer program product of claim 20 wherein the device under test includes an amplifier.

* * * * *